United States Patent [19]
Cho

[11] Patent Number: 5,384,269
[45] Date of Patent: Jan. 24, 1995

[54] METHODS FOR MAKING AND USING A SHALLOW SEMICONDUCTOR JUNCTION

[75] Inventor: Jaeshin Cho, Gilbert, Ariz.

[73] Assignee: Motorola, Inc., Schaumburg, Ill.

[21] Appl. No.: 221,546

[22] Filed: Mar. 31, 1994

Related U.S. Application Data

[63] Continuation of Ser. No. 987,870, Dec. 9, 1992, abandoned.

[51] Int. Cl.⁶ .......................................... H01L 21/265
[52] U.S. Cl. .................................... 437/22; 437/176; 437/934; 437/950
[58] Field of Search ................. 437/22, 176, 184, 934, 437/936, 950, 959, 987; 148/DIG. 40, DIG. 56, DIG. 65, DIG. 84, DIG. 139, DIG. 140, DIG. 144

[56] References Cited

U.S. PATENT DOCUMENTS

| | | | |
|---|---|---|---|
| 3,907,616 | 9/1975 | Wiemer | 437/164 |
| 4,383,869 | 5/1983 | Liu | 437/22 |
| 4,421,577 | 12/1983 | Spicer | 148/DIG. 84 |
| 4,808,545 | 2/1989 | Balasubramanyam et al. | 437/176 |
| 4,892,835 | 1/1990 | Rabinzohn et al. | 437/22 |
| 4,902,635 | 2/1990 | Imamura et al. | 437/176 |
| 4,910,157 | 3/1990 | Hasegawa et al. | 437/22 |
| 5,144,410 | 9/1992 | Johnson | 257/745 |

FOREIGN PATENT DOCUMENTS 0252300 1/1988 European Pat. Off. .
0022428 1/1987 Japan .

OTHER PUBLICATIONS

Anderson et al., "Ohmic contacts to GaAs...", Conf. paper at Ohmic Contacts, Mar. 1981, pp. 39–42.

Howes et al., "Gallium Arsenide, materials devices & circuits", 1985, pp. 163–165.

*Primary Examiner*—Brian E. Hearn
*Assistant Examiner*—Chandra Chaudhari
*Attorney, Agent, or Firm*—Joe E. Barbee

[57] ABSTRACT

A method for making a shallow junction in a gallium arsenide substrate including implanting doping ions into an upper surface of the substrate and incorporating sulfur into the upper surface of the substrate after the ion implantation. A capping layer is deposited on the upper surface and the substrate is heat annealed to activate the doping atoms.

14 Claims, 1 Drawing Sheet

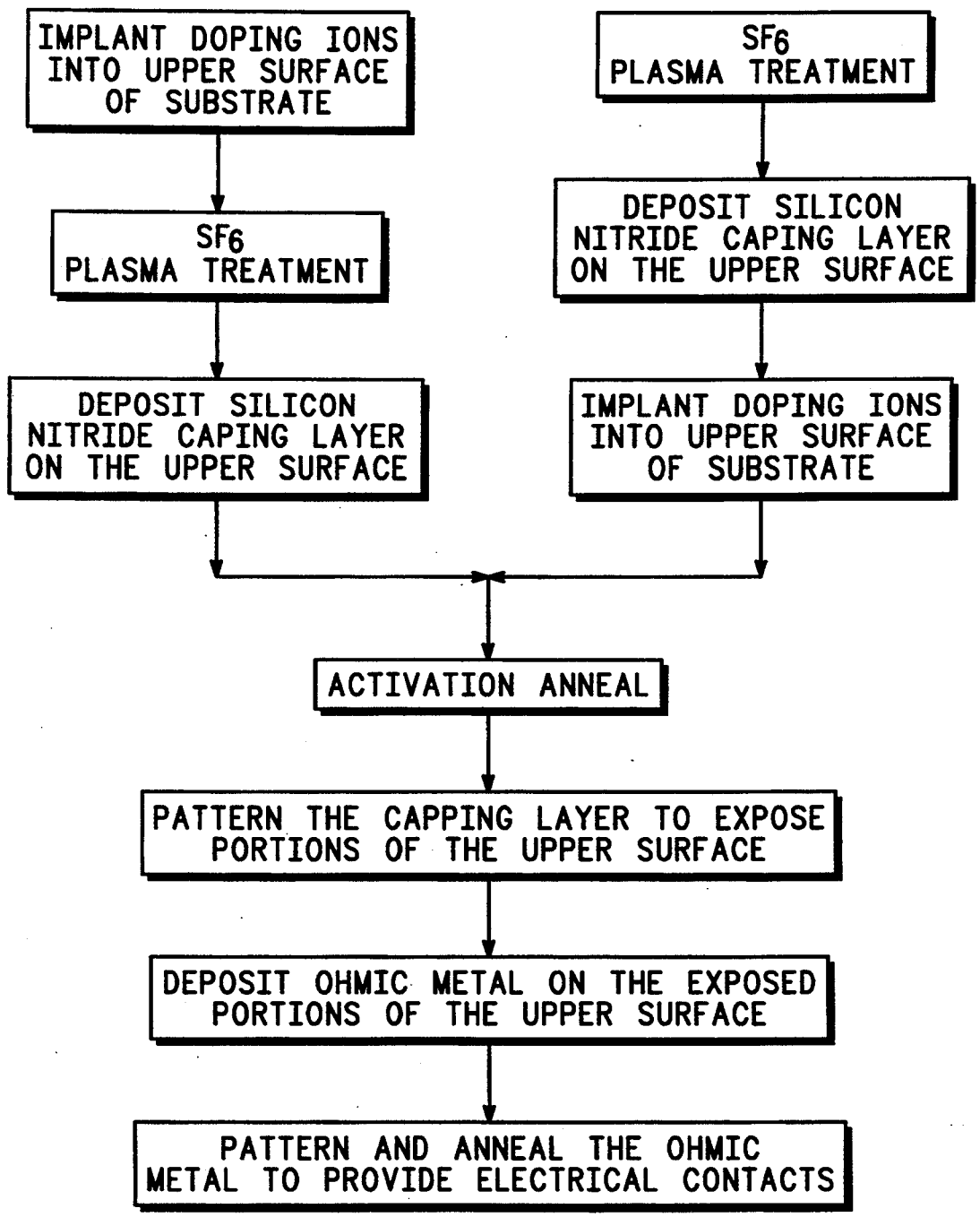

METHODS FOR MAKING AND USING A SHALLOW SEMICONDUCTOR JUNCTION

This application is a continuation of prior application Ser. No. 07/987,870 now abandoned filed DEC. 9, 1992.

BACKGROUND OF THE INVENTION

The present invention relates, in general, to ion implantation, and more particularly, to a method for making a shallow junction in gallium arsenide.

As semiconductor device dimensions shrink laterally, designers must scale the vertical dimensions of the devices as well. One important vertical dimension is junction depth. Ion implantation is a popular method for creating shallow junctions in semiconductor and semi-insulating substrates during the manufacture of electronic devices. Ion implantation provides accurate dose control of chosen atomic species, and provides greater uniformity of dose across the substrate.

Following implantation, the substrates are annealed by heat treatment or the like to make the dopant atoms electrically active. In the case of gallium arsenide substrates, an upper surface of the substrate is usually covered with a capping layer of silicon nitride, silicon oxide, aluminum nitride, or the like to protect the surface and prevent outgassing of arsenic during the anneal heat treatment.

Silicon is the most widely used implanted species for n-type dopant into gallium arsenide. Unfortunately, activation efficiency of silicon using conventional capping and heat treatment processes varies from less than ten percent to nearly eighty percent. Activation efficiency means the percentage of implanted dopant that actually becomes electrically active. To make low contact resistance ohmic contacts to semiconductor, it is necessary that the doped regions have high carrier concentrations and low resistivity. The effect of low activation efficiency is high resistivity doped regions. Because metal used for electrical contacts in integrated circuits can only make low resistance ohmic contact to low resistivity regions, the low and variable activation efficiency provided by conventional processing required manufacturers use large surface area contacts, use higher concentrations of dopant atoms, and accept lower device yields.

What is needed is a process for making shallow semiconductor junctions that provides higher carrier concentration and lower resistivity regions in gallium arsenide substrates.

SUMMARY OF THE INVENTION

Briefly stated, the advantages of the present invention are achieved by a method for making a shallow junction in a gallium arsenide substrate including implanting doping ions into an upper surface of the substrate and incorporating sulfur into the upper surface of the substrate after the ion implantation. A capping layer is deposited on the upper surface and the substrate is heat annealed to activate the doping atoms.

BRIEF DESCRIPTION OF THE DRAWINGS

The sole FIGURE illustrates a flow chart of a process in accordance with the present invention.

DETAILED DESCRIPTION OF THE DRAWINGS

The sole illustration shows a flow chart of a process in accordance with the present invention. The process in accordance with the present invention is intended to be performed on a semiconductor or semi-insulator substrate such as gallium arsenide (GaAs) or the like. In a preferred embodiment, the substrate includes one or more epitaxial layers formed on an upper surface of the substrate, and has electronic devices formed in the upper surface. For ease of description, the term "substrate" as used herein is intended to include unprocessed substrates as well as substrates having epitaxial layers and devices formed therein.

A first process in accordance with the present invention is illustrated by the upper left branch of flow chart shown in the figure. Ions are implanted in selected portions of the substrate using conventional ion implantation techniques. Ion implantation accelerates ions of a desired species into the upper surface of the substrate. In the preferred embodiment, silicon ions are accelerated by ion implantation in the upper surface of a GaAs substrate to create n-type regions in the substrate.

In contrast to conventional processing, the process in accordance with the present invention includes a surface treatment following the ion implantation. The surface treatment incorporates sulfur into the upper surface of the substrate. Sulfur is known to be an n-type dopant in GaAs. A preferred method of performing the surface treatment is by exposing the upper surface of the substrate to sulfur hexafluoride ($SF_6$) in a plasma. The $SF_6$ is ionized in the plasma usually by radio frequency energy supplied in the plasma reactor.

The plasma treatment is desirably performed for about thirty to sixty seconds, but substantial results are achieved by treatment of greater than 15 seconds. The shallow junction is formed by the diffusion of sulfur into the GaAs substrates as well as the activation of implanted silicon during subsequent heat treatment.

As shown in the figure, the plasma treatment is followed by a deposition of a capping layer. Suitable materials for the capping layer include silicon nitride, aluminum nitride, silicon oxide, or the like. In the preferred embodiment, silicon nitride is used. After the capping layer is deposited, an activation anneal is performed by heat treating the substrate to activate the dopant atoms. A typical heat treatment is performed at 810° C. for five minutes using a rapid thermal anneal (RTA) process.

An alternative process in accordance with the present invention is illustrated by the upper right branch of the flow chart shown in the figure. In the alternative process the $SF_6$ plasma treatment is performed first, followed by deposition of the capping layer. The ion implantation is performed through the capping layer. After ion implantation, the activation anneal is performed. The detail of each of the process steps is substantially similar to that described in reference to the first process and is not repeated.

Although the low resistivity region formed by the process in accordance with the present invention may be valuable by itself as a portion of a semiconductor device or integrated circuit, it is particularly valuable in forming electrical contact to the substrate. To form contacts, the capping layer is patterned or removed to expose portions of the upper surface that have been implanted and plasma treated. Once exposed, ohmic metal is deposited to make electrical contact to the exposed portions of the upper surface. The ohmic metal may be heat treated and patterned to form contacts on the surface of the substrate. By using the shallow junction in accordance with the present invention, low resistance, small area electrical contacts are reproducibly manufactured.

I claim:

1. A method for making a shallow junction in a gallium arsenide substrate comprising the steps of:
   implanting doping ions into an upper surface of the substrate;
   treating the upper surface of the substrate with an $SF_6$ plasma;
   depositing a silicon nitride layer on the upper surface;
   simultaneously diffusing sulfur into the substrate while activating the doping ions; and
   depositing an ohmic metal layer on the upper surface after the step of diffusing sulfur.

2. The method of claim 1 wherein simultaneously diffusing sulfur into the substrate while activating the doping ions includes annealing the substrate at an elevated temperature.

3. The method of claim 1 wherein the step of implanting doping ions comprise implanting silicon ions.

4. The method of claim 1 wherein the step of treating the upper surface further comprises exposing the upper surface to a plasma formed by ionizing $SF_6$ for at least 15 seconds.

5. The method of claim 4 wherein the step of treating the upper surface is performed in a radio frequency plasma reactor.

6. A method for forming a shallow junction in a gallium arsenide substrate comprising the steps of:
   providing a gallium arsenide substrate having an upper surface;
   implanting doping ions into the upper surface;
   treating the upper surface with an $SF_6$ plasma;
   depositing a capping layer on the upper surface;
   simultaneously diffusing sulfur into the substrate while activating the doping ions;
   patterning the capping layer to expose portions of the upper surface after the step of diffusing sulfur;
   depositing an ohmic metal layer on the exposed portions of the upper surface after the step of diffusing sulfur; and
   patterning the ohmic metal layer to provide electrical contacts to the exposed portions of the upper surface.

7. The method of claim 6 wherein simultaneously diffusing sulfur into the substrate while activating the doping ions includes heat treating the substrate.

8. The method of claim 6 wherein the step of implanting doping ions includes the step of accelerating silicon ions into the upper surface of the substrate.

9. The method of claim 6 wherein the step of depositing the capping layer further comprises depositing a layer of silicon nitride by chemical vapor deposition.

10. A method for making a shallow junction in a gallium arsenide substrate comprising the steps of:
    implanting doping ions into an upper surface of the substrate;
    incorporating sulfur into the upper surface of the substrate;
    depositing a capping layer on the upper surface;
    simultaneously diffusing sulfur into the substrate while activating the doping ions; and
    depositing an ohmic metal layer on the upper surface after the step of diffusing sulfur.

11. The method of claim 10 wherein the steps of depositing the capping layer includes depositing silicon nitride by chemical vapor deposition.

12. The method of claim 11 wherein simultaneously diffusing sulfur into the substrate while activating the doping ions includes annealing the substrate at an elevated temperature.

13. The method of claim 12 wherein the step of implanting doping ions comprise implanting silicon ions.

14. The method of claim 13 wherein the step of incorporating sulfur into the upper surface further comprises ionizing $SF_6$ in a plasma and exposing the upper surface to the ionized $SF_6$.

* * * * *